United States Patent [19]
Fiduccia et al.

[11] Patent Number: 5,894,142
[45] Date of Patent: Apr. 13, 1999

[54] ROUTING FOR INTEGRATED CIRCUITS

[75] Inventors: Nicholas S. Fiduccia, Saratoga; Richard M. McClosky; David N. Goldberg, both of San Jose, all of Calif.

[73] Assignee: Hewlett-Packard Company, Palo Alto, Calif.

[21] Appl. No.: 08/763,501

[22] Filed: Dec. 11, 1996

[51] Int. Cl.⁶ ..................... H01L 23/48
[52] U.S. Cl. ........... 257/207; 257/208; 257/210; 257/211; 257/758; 438/622
[58] Field of Search .............. 257/207, 208, 257/210, 211, 209, 665, 758; 326/41, 47; 438/618, 622

[56] References Cited

U.S. PATENT DOCUMENTS

| | | | |
|---|---|---|---|
| 5,095,352 | 3/1992 | Noda et al. | 257/211 |
| 5,111,271 | 5/1992 | Hatada et al. | 257/207 |
| 5,742,099 | 4/1998 | Debnath et al. | 257/207 |

FOREIGN PATENT DOCUMENTS 1-270330  10/1989  Japan ...................... 326/47

*Primary Examiner*—John Guay

[57] ABSTRACT

Signals are routed within a routing channel between a first logic block and a second logic block. A power signal within a power conductor is routed as part of a bottom layer of the routing channel. The bottom layer is located above a substrate for the integrated circuit. A ground signal is also routed within a ground conductor as part of the bottom layer of the routing channel. Data lines are routed in a top layer of the routing channel. The data lines carry data signals within the routing channel. Connection lines are routed within a middle layer of the routing channel. The middle layer is between the bottom layer of the routing channel and the top layer of the routing channel. The connecting lines connect a subset of the data lines in the top layer, the ground conductor in the bottom layer and the power conductor in the bottom layer to the first logic block and to the second logic block.

18 Claims, 6 Drawing Sheets

ROUTING FOR INTEGRATED CIRCUITS

BACKGROUND

The present invention concerns the design and manufacture of very large scale integrated (VLSI) circuits and pertains particularly to improved routing between logic blocks of integrated circuits.

When designing integrated circuits, logic blocks are located on the integrated circuit. Area between the logic blocks is utilized as routing channels. Within the routing channels are placed conductive lines which carry a power signal, a ground signal, a clock signal and various data signals. These signals are routed to the logic blocks.

A routing channel typically has several metal layers. The top layers, furthest from the substrate, are the most conductive and are generally utilized to distribute the power signal and the ground signal. The lower layers, closer to the substrate, are generally used to route data signals. These lower layers are less conductive than the top layers.

One problem with the typical assignment of routing layers is that some critical signals may not meet the target frequency of a design. One way to handle this is to "promote" these critical signals to run in the top layer. This solution, however, has several disadvantages. For example, because the top layer is generally reserved for the power signal and the ground signal, running a critical signal in the top layer is an exception to the general rule of reserving the top layer for the power signal and the ground signal. Implementing this exception can add to the cost of implementation. Also, care must be taken to prevent a critical signal promoted to the top layer from being located immediately above a signal on a lower layer, as this may cause excessive coupling noise, also known as crosstalk.

SUMMARY OF THE INVENTION

In accordance with the preferred embodiment of the present invention, signals are routed within a routing channel between a first logic block and a second logic block. A power signal carried by a power conductor is routed as part of a bottom layer of the routing channel. The bottom layer is located above a substrate for the integrated circuit. A ground signal carried by a ground conductor is also routed as part of the bottom layer of the routing channel. Data lines are routed in a top layer of the routing channel. The data lines carry data signals within the routing channel. Connection lines are routed within a middle layer of the routing channel. The middle layer is between the bottom layer of the routing channel and the top layer of the routing channel. The connecting lines connect a subset of the data lines in the top layer, the ground conductor in the bottom layer, and the power conductor in the bottom layer to the first logic block and to the second logic block.

In one preferred embodiment, the top layer of the routing channel also includes a clock line which carries a clock signal, a ground line which carries the ground signal, and a power line which carries the power signal. A first connection line in the middle layer connects the ground line in the top layer to the ground conductor in the bottom layer. A second connection line in the middle layer connects the power line in the top layer to the power conductor in the bottom layer.

In an alternative embodiment of the present invention, data lines are routed in the middle layer of the routing channel. Connection lines are routed within the top layer of the routing channel. The connecting lines connect a subset of the data lines in the top layer to the first logic block and to the second logic block. In this embodiment, the middle layer of the routing channel may also include a clock line which carries a clock signal, a ground line which carries the ground signal, and a power line which carries the power signal. At various points in the routing channel, the ground line in the middle layer is connected to the ground conductor in the bottom layer, and the power line in the middle layer is connected to the power conductor in the bottom layer.

The present invention provides for an efficient and effective way to route data, power and ground signals within a routing channel.

DESCRIPTION OF THE PREFERRED EMBODIMENT

Figure 1:
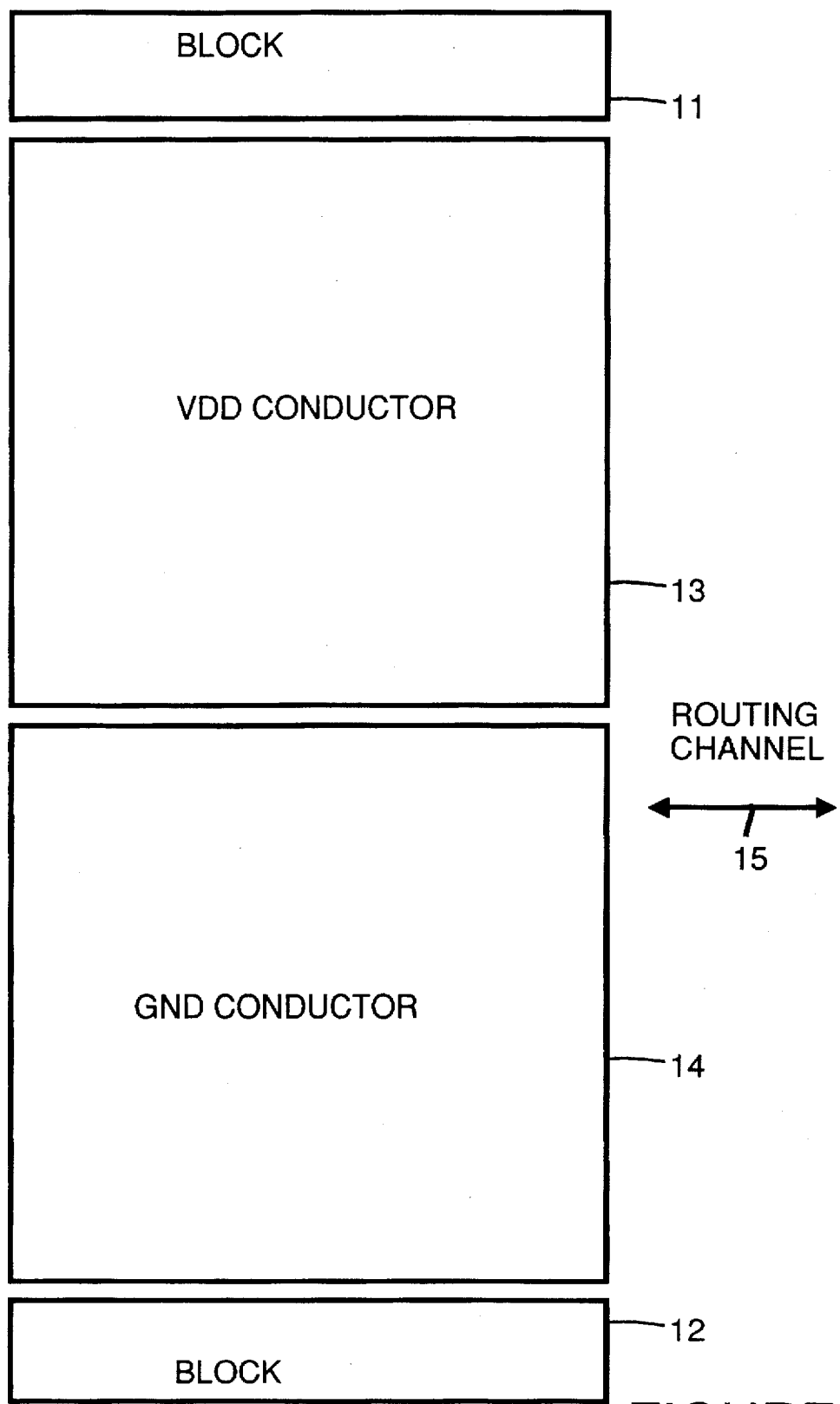
FIG. 1 shows a top view of a sample bottom layer in a routing channel in accordance with a preferred embodiment of the present invention.

FIG. 1 shows a top view of a sample bottom layer in a routing channel in accordance with a preferred embodiment of the present invention. The routing channel runs between a logic block 11 and a logic block 12 in the direction of arrows 15. The bottom layer is devoted exclusively to carrying a power signal in a power (VDD) conductor 13 and a ground signal in a ground (GND) conductor 14.

Figure 2:
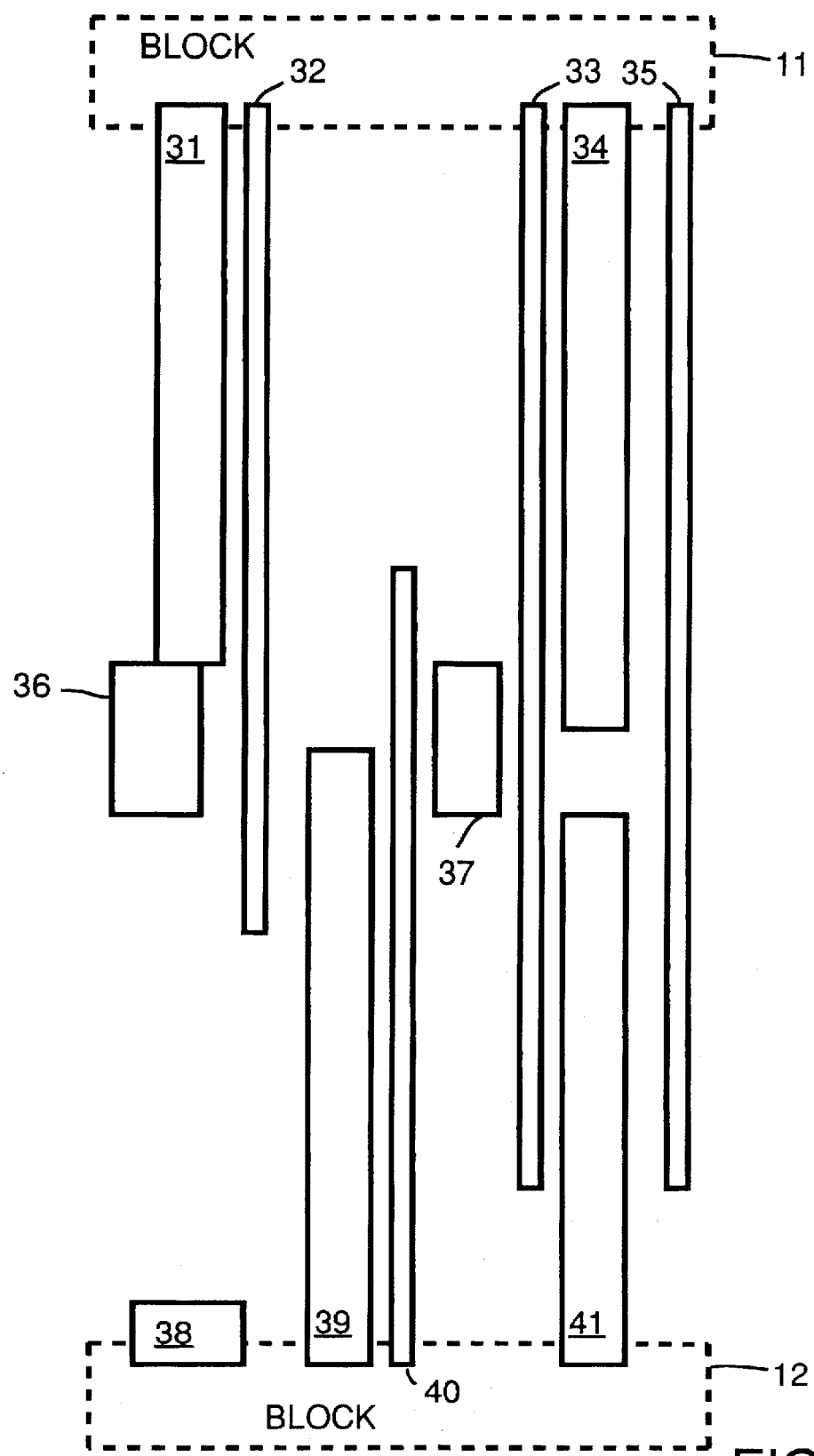
FIG. 2 shows a top view of a sample middle layer in a routing channel in accordance with a preferred embodiment of the present invention.

FIG. 2 shows a top view of a sample middle layer in the routing channel in accordance with a preferred embodiment of the present invention. The middle layer is used to connect power (VDD) conductor 13 and ground signal in the bottom channel layer and data lines and a clock line in the top channel layer to logic block 11 and logic block 12. The middle layer is also used to connect power (VDD) conductor 13 and ground (GND) conductor 14 in the bottom channel layer, respectively with a power and a data line within the top channel layer. In FIG. 2, a connection line 31, a connection line 32, a connection line 33, a connection line 34, a connection line 35, a connection line 36, a connection line 37, a connection line 38, a connection line 39, a connection line 40, a connection line 41 are shown to be contained within the middle layer in the routing channel.

Figure 3:
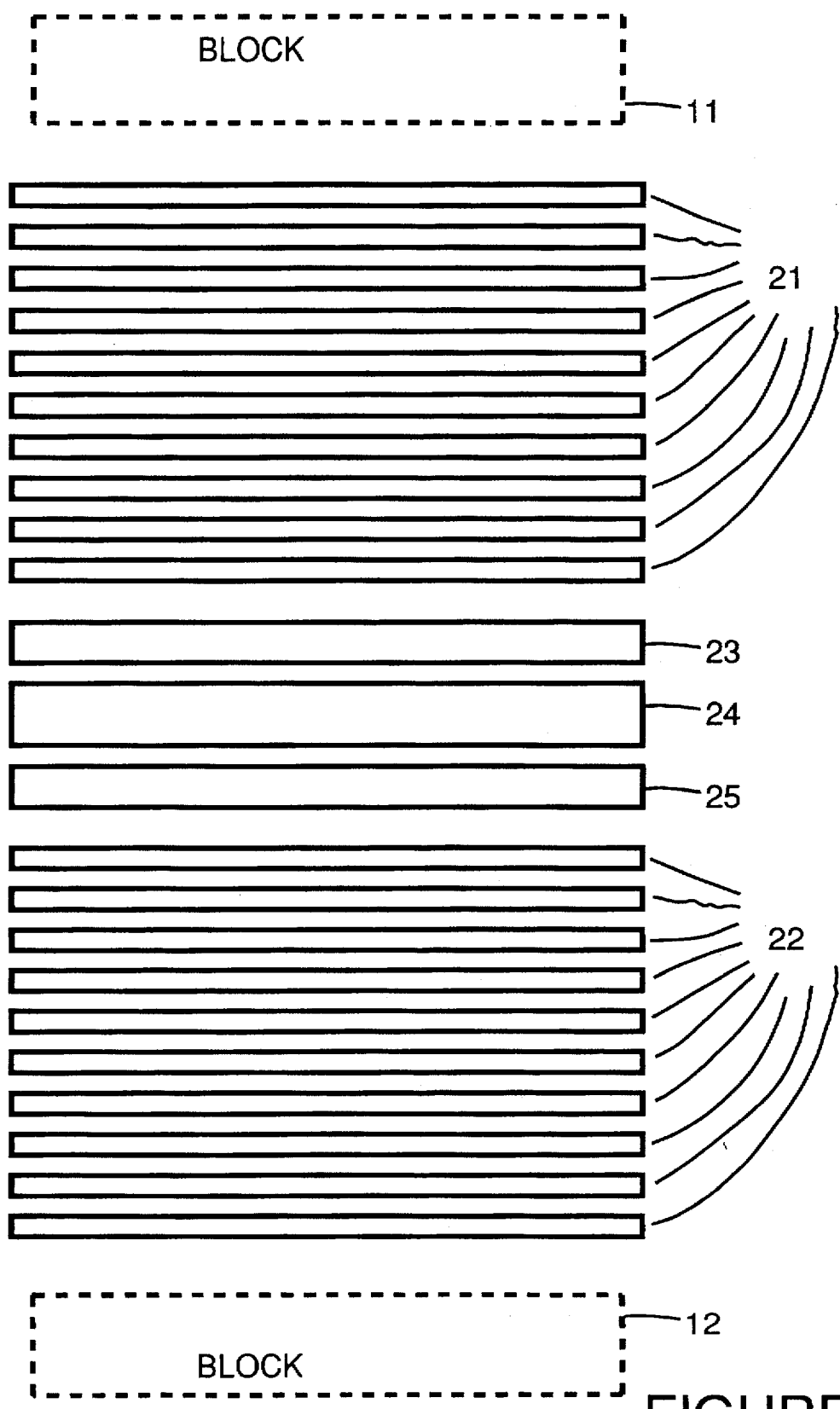
FIG. 3 shows a top view of a sample top layer in a routing channel in accordance with a preferred embodiment of the present invention.

FIG. 3 shows a top view of a sample top layer in the routing channel in accordance with a preferred embodiment of the present invention. The top layer is used primarily for data signals. These data signals are carried in routing data lines 21 and routing data lines 22. Additionally, a clock line 24 is routed in the top routing channel layer. Also, in the embodiment of the present invention shown in FIG. 3, a ground (GND) line 23 and a power (VDD) line 25 are included in the top layer of the routing channel.

Figure 4:
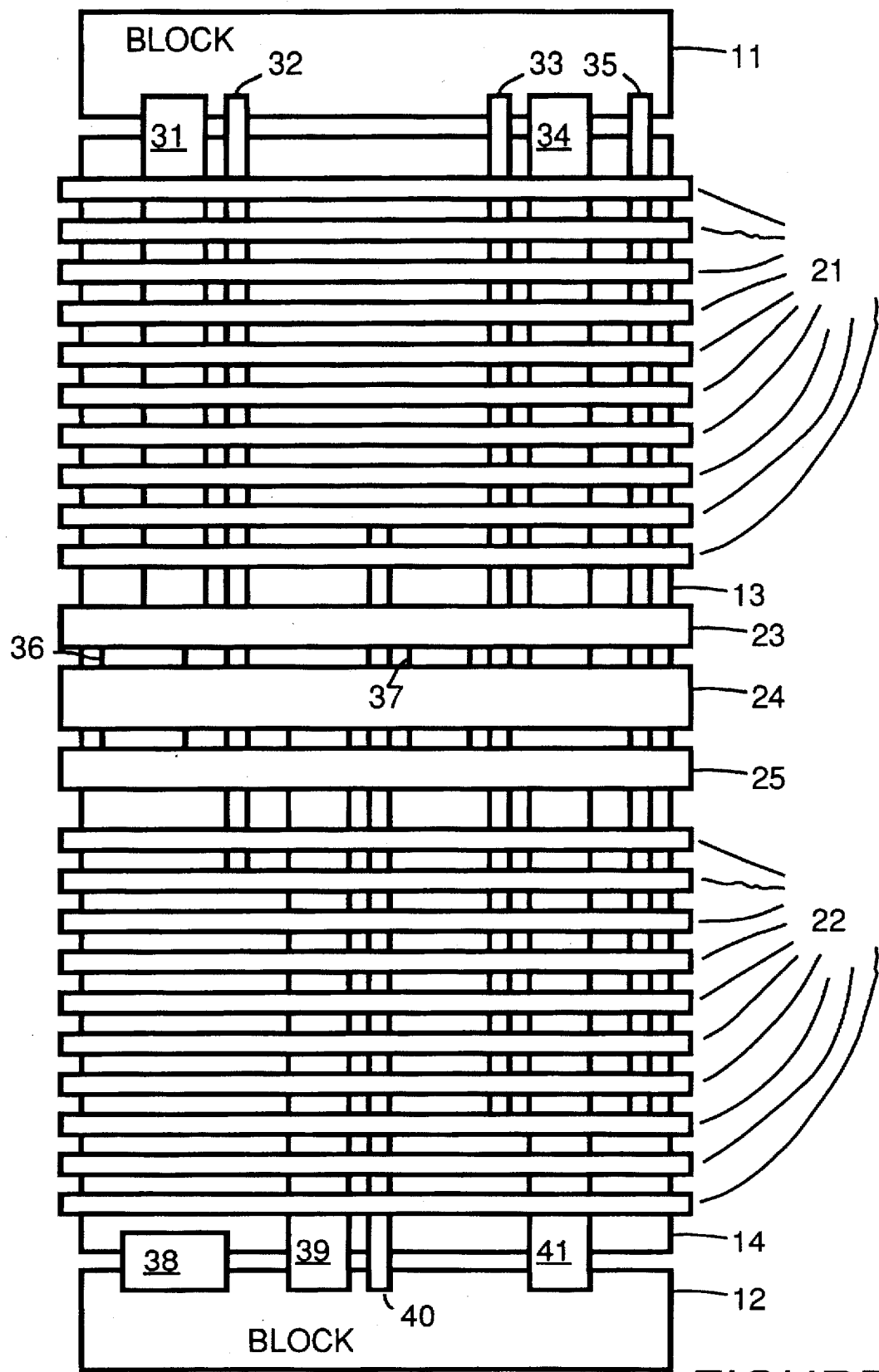
FIG. 4 shows a top view of a three layer routing channel in accordance with a preferred embodiment of the present invention.

FIG. 4 shows a top view of the three layer routing channel, with all layers present. As can be seen from FIG. 4, connection line 31 connects logic block 11 with ground line 23. Connection line 32, connection line 33 and connection line 35 each connect logic block 11 with a data signal on one of routing data lines 22. Connection line 34 connects logic block 11 with clock line 24. Connection line 36 connects ground line 23 with ground conductor 14. Connection line 37 connects power line 25 with power conductor 13. Connection line 38 connects logic block 12 with ground conductor 14. Connection 39 connects logic block 12 with clock line 24. Connection line 40 connects logic block 11 with a data signal on one of routing data lines 21. Connection conductor 41 connects logic block 12 with power line 25. Connectors are utilized to make electrical connections between connector lines located on different layers in the routing channel.

Figure 5:
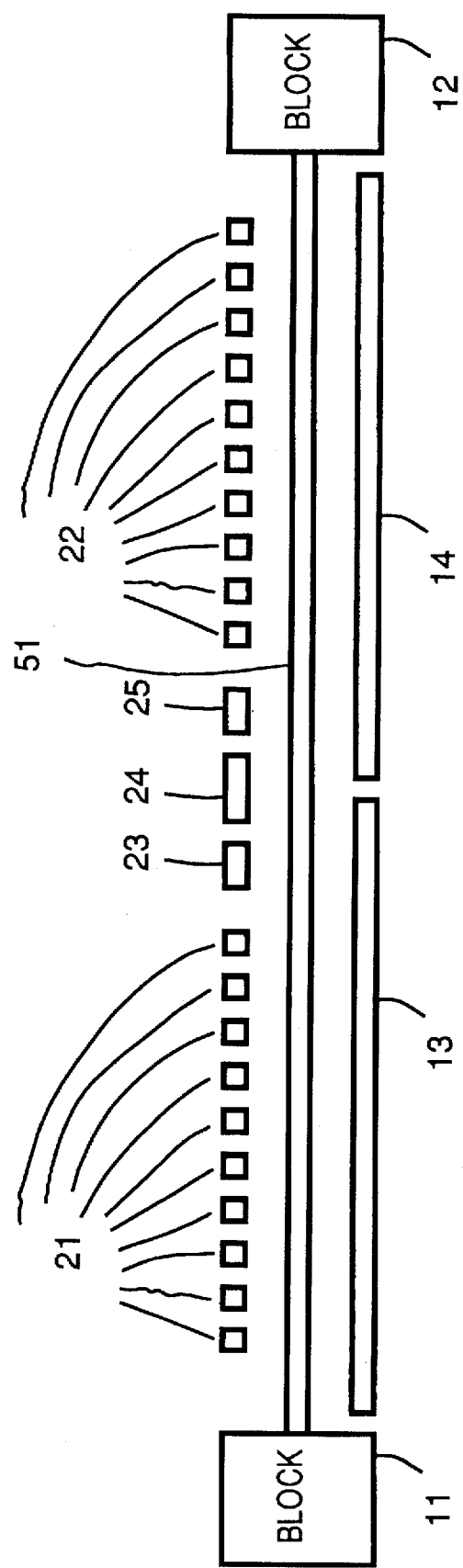
FIG. 5 shows a side view of a three layer routing channel in accordance with a preferred embodiment of the present invention.

FIG. 5 shows a side view looking down the routing channel between logic block 11 and logic block 12. Power conductor 13 and ground conductor 14 are shown to be on the bottom layer of the routing channel. The connecting lines in the middle layer are represented by connecting lines 51. Data lines 21, data lines 22, clock line 24, ground (GND) line 23 and power (VDD) line 25 are shown to be in the top layer of the routing channel.

Figure 6:
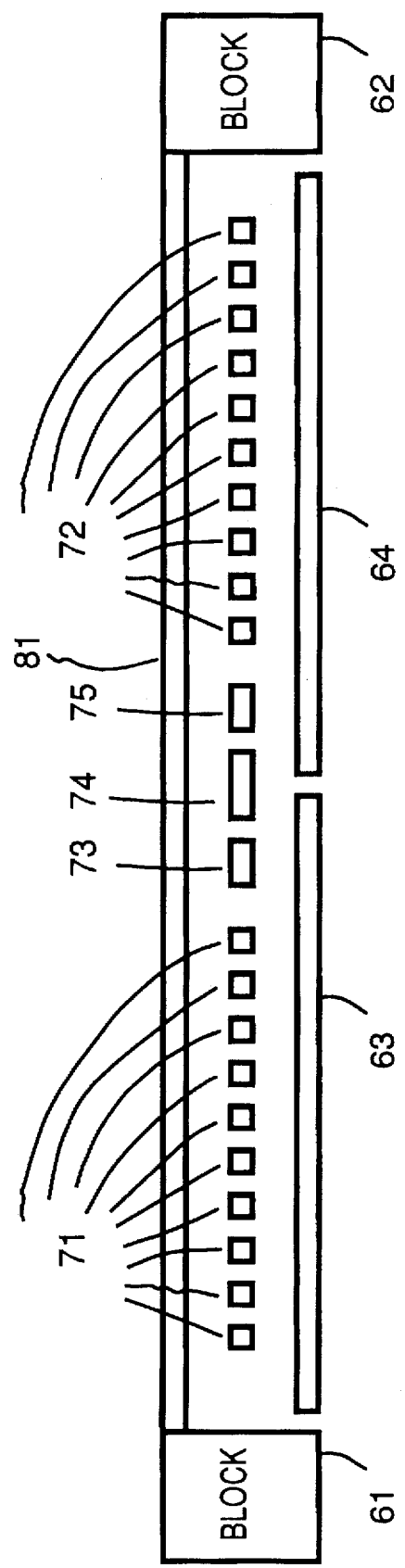
FIG. 6 shows a side view of a three layer routing channel in accordance with an alternative preferred embodiment of the present invention.

FIG. 6 illustrates an alternative embodiment of the present invention where connection lines are placed in the top layer. For this embodiment, FIG. 6 shows a side view looking down the routing channel between a logic block 61 and a logic block 62. A power conductor 63 and a ground conductor 64 are shown to be on the bottom layer of the routing channel. Data lines 71, data lines 72, a power (VDD) line 73, a clock line 74 and a ground (GND) line 74 are shown to be in a middle layer of the routing channel. Connecting lines in a top layer are represented by connecting lines 81. At various locations within the routing channel, power line 73 is connected to power conductor 63, and ground line 74 is connected to ground conductor 64.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An integrated circuit comprising:

a first logic block;

a second logic block; and, a routing channel located between the first logic block and the second logic block, the routing channel comprising:
 a bottom layer, located above a substrate for the integrated circuit, the bottom layer including,
  a power conductor which carries a power signal, and
  a ground conductor which carries a ground signal,
 a middle layer, located above the bottom layer, the middle layer containing connection lines which make connections to the first logic block and the second logic block, and
 a top layer, located above the middle layer, the top layer containing data lines which carry data signals within the routing channel.

2. An integrated circuit as in claim 1 wherein the top layer additionally contains a clock line which carries a clock signal.

3. An integrated circuit as in claim 1 wherein the top layer additionally contains:

a ground line which carries the ground signal; and, a power line which carries the power signal.

4. An integrated circuit as in claim 3 wherein a first connection line in the middle layer connects the ground line in the top layer to the ground conductor in the bottom layer; and, a second connection line in the middle layer connects the power line in the top layer to the power conductor in the bottom layer.

5. A method for routing signals within a routing channel between a first logic block and a second logic block which are part of an integrated circuit, the method comprising the steps of:

(a) routing a power signal, carried by a power conductor, as part of a bottom layer of the routing channel, the bottom layer being located above a substrate of the integrated circuit;

(b) routing a ground signal, carried by a ground conductor, as part of the bottom layer of the routing channel;

(c) routing data lines in a top layer of the routing channel, the data lines carrying data signals within the routing channel; and, (d) routing connection lines within a middle layer of the routing channel, the middle layer being between the bottom layer of the routing channel and the top layer of the routing channel, the connecting lines connecting a subset of the data lines in the top layer, the ground conductor in the bottom layer and the power conductor in the bottom layer to the first logic block and to the second logic block.

6. A method as in claim 5 wherein step (c) includes routing within the top layer of the routing channel a clock line which carries a clock signal.

7. A method as in claim 5 wherein step (c) includes the following substeps:

routing within the top layer of the routing channel a ground line which carries the ground signal; and, routing within the top layer of the routing channel a power line which carries the power signal.

8. A method as in claim 7 wherein step (d) includes the following substeps:

routing a first connection line in the middle layer to connect the ground line in the top layer to the ground conductor in the bottom layer; and, routing a second connection line in the middle layer to connect the power line in the top layer to the power conductor in the bottom layer.

9. An integrated circuit comprising:

a first logic block;

a second logic block; and, a routing channel located between the first logic block and the second logic block, the routing channel comprising:
 a bottom layer, located above a substrate for the integrated circuit, the bottom layer including,
  a power conductor which carries a power signal, and
  a ground conductor which carries a ground signal,
 a middle layer, located above the bottom layer, the middle layer containing data lines which carry data signals within the routing channel, and a top layer, located above the middle layer, the top layer containing connection lines which make connections between the data lines in the middle layer to the first logic block and the second logic block.

10. An integrated circuit as in claim 9 wherein the middle layer additionally contains a clock line which carries a clock signal.

11. An integrated circuit as in claim 9 wherein the middle layer additionally contains a ground line which carries the ground signal, and a power line which carries the power signal.

12. An integrated circuit as in claim 11 wherein a first connection connects the ground line in the middle layer to the ground conductor in the bottom layer; and, a second connection connects the power line in the middle layer to the power conductor in the bottom layer.

13. A method for routing signals within a routing channel between a first logic block and a second logic block, the method comprising the steps of:

(a) routing a power signal within a power conductor as part of a bottom layer of the routing channel, the bottom layer being located above a substrate for the integrated circuit;

(b) routing a ground signal within a ground conductor as part of the bottom layer of the routing channel;

(c) routing data lines in a middle layer of the routing channel, the data lines carrying data signals within the routing channels; and, (d) routing connection lines within a top layer of the routing channel, the top layer being above the middle layer of the routing channel, the connecting lines connecting a subset of the data lines in the middle layer to the first logic block and to the second logic block.

14. A method as in claim 13 wherein step (c) includes routing within the middle layer of the routing channel a clock line which carries a clock signal.

15. A method as in claim 13 wherein step (c) includes the following substeps:

routing within the middle layer of the routing channel a ground line which carries the ground signal; and, routing within the middle layer of the routing channel a power line which carries the power signal.

16. A method as in claim 15 wherein step (d) includes the following substeps:

connecting the ground line in the middle layer to the ground conductor in the bottom layer; and, connecting the power line in the middle layer to the power conductor in the bottom layer.

17. An integrated circuit comprising:

a first logic block;

a second logic block; and, a routing channel located between the first logic block and the second logic block, the routing channel comprising:

a bottom layer, located above a substrate for the integrated circuit, the bottom layer including, a power conductor which carries a power signal, and a ground conductor which carries a ground signal, a first layer, located above the bottom layer, the first layer containing data lines which carry data signals within the routing channel, and a second layer, located above the bottom layer, the second layer containing connection lines which make connections to the first logic block and the second logic block.

18. A method for routing signals within a routing channel between a first logic block and a second logic block, the method comprising the steps of:

(a) routing a power signal, carried by a power conductor, as part of a bottom layer of the routing channel, the bottom layer being located above a substrate for the integrated circuit;

(b) routing a ground signal, carried by a ground conductor, as part of the bottom layer of the routing channel;

(c) routing data lines in a first additional layer of the routing channel, the data lines carrying data signals within the routing channel; and, (d) routing connection lines within a second additional layer of the routing channel, the connecting lines connecting a subset of the data lines in the first additional layer, the ground conductor in the bottom layer and the power conductor in the bottom layer to the first logic block and to the second logic block.

* * * * *